United States Patent [19]

Bloomfield et al.

[11] Patent Number: 4,800,048
[45] Date of Patent: Jan. 24, 1989

[54] DIE DRAWING PROCESS AND APPARATUS FOR PIEZOELECTRIC POLYMER FILMS AND TUBES

[75] Inventors: Philip E. Bloomfield, Lower Merion; Richard A. Ferren, Lower Gwynedd; Dean H. Wickwire, Glen Moore, all of Pa.

[73] Assignee: Pennwalt Corporation, Philadelphia, Pa.

[21] Appl. No.: 126,993

[22] Filed: Nov. 30, 1987

Related U.S. Application Data

[63] Continuation of Ser. No. 835,500, Mar. 3, 1986, abandoned, which is a continuation of Ser. No. 590,106, Mar. 16, 1984.

[51] Int. Cl.$^4$ .............................................. B29C 47/02
[52] U.S. Cl. ..................................... 264/22; 264/24; 264/27; 264/104; 264/174; 264/209.5; 264/288.4; 264/346; 425/113; 425/174.6; 425/174.8 E

[58] Field of Search ............... 264/22, 24, 27, 104, 264/108, 174, 209.1, 209.3–209.5, 288.4, 346; 425/174.8 E, 174.6, 113

[56] References Cited

U.S. PATENT DOCUMENTS

| | | | |
|---|---|---|---|
| 3,275,730 | 9/1966 | Feild | 264/174 |
| 3,290,420 | 12/1966 | Orser | 264/210.1 |
| 3,417,176 | 12/1968 | Anderson et al. | 264/209.5 |
| 4,427,609 | 1/1984 | Broussoux et al. | 264/24 |
| 4,486,365 | 12/1984 | Kliemann et al. | 264/24 |
| 4,557,880 | 12/1985 | Pantelis | 264/104 |

Primary Examiner—Jeffery Thurlow

[57] ABSTRACT

Apparatus and processes for preparing polymeric piezoelectric films of one or more layers or tubular products having a central wire core by drawing a suitable polymeric blank through either a flat or a conically tapered drawing die having associated electrical field producing means, to simultanelusly stretch and pole the polymeric material within the die chamber.

22 Claims, 3 Drawing Sheets

DIE DRAWING PROCESS AND APPARATUS FOR PIEZOELECTRIC POLYMER FILMS AND TUBES

This is a continuation of co-pending application Ser. No. 06/835,500 filed on Mar. 3, 1986 now abandoned, which is a continuation of application Ser. No. 06/590,106, filed Mar. 16, 1984.

BACKGROUND OF THE INVENTION

This invention relates to processes and apparatus for producing piezoelectric polymers in the form of single or multi-layer films or tubular products having a central wire-type core by means of die drawing with simultaneous electrical poling. The obtaining of piezoelectric properties devolves from the existence of permanent dipolar orientation which does not exist when the polymer material crystallizes from the molten state.

Typical among the polymeric materials which are able to acquire piezoelectric properties are: polyvinylchloride (PVC), polyvinylfluoride (PVF), polyvinylidene fluoride and its copolymers with polytetrafluoroethylene, polytrifluoroethylene, polyvinylfluoride and mixtures using polymethylmethacrylate.

Typical prior art processes for preparing piezoelectric polymeric films are such as disclosed in U.S. Pat. No. 4,427,609 to Broussoux et al. that issued Jan. 24, 1984.

Preparation of piezoelectric tubular products having a wire core is disclosed in the paper published by Pantellis of British Telecom Research Laboratories. In the Pantellis process a polymeric tubular blank having a central wire core is drawn between two sets of draw rolls having a heated neckdown region therebetween whereby the polymer draw takes place in an extremely narrow neckdown region.

In applicant's invention the tubular blank having a wire core is pulled through a tapered die and much higher levels of piezo activity can be created because the drawing is taking place throughout the length of the interior of the tapered die chamber and the polymeric material throughout the entire die chamber can be exposed to an electric field to provide far higher piezo activity than with the heated neckdown technique of Pantellis.

In the Broussoux method of U.S. Pat. No. 4,427,609, the polymer blank orientation must be in the alpha phase initially and the drawing takes place between the nip of opposed crushing rolls. However, with the process of the present invention the initial polymer blank can be in any phase, alpha, beta, or gamma, or any combination thereof, and a useful piezo product provided.

BRIEF SUMMARY OF THE INVENTION

The process of this invention is defined as a process for the production of a piezoelectric polymer product by mechanical stretching and simultaneous electrical polarization, comprising:

(a) forming a polymer material blank having a thickness that exceeds that of the polymer product;
(b) stretching the blank and reducing the thickness of the blank by pulling the blank between opposed converging stationary surfaces while maintaining the polymer material blank at a temperature below its melting point, said surfaces defining a stretching chamber having an entrance opening of a dimension substantially equal to or greater than the blank thickness and an exit opening of a dimension that is about equal to the product thickness;
(c) simultaneously, while stretching in (b), applying an electric field across the thickness of the blank within the stretching chamber, said electric field having a direct current voltage that is below the breakdown voltage of the material but the voltage, in combination with the residence time of the blank within the chamber, is of sufficient intensity to provide the electrical polarization to form the piezoelectric polymer product that is being pulled from the stretching chamber.

In another embodiment of the invention the process is defined as the above process wherein the product is a film and in (b) the opposed stationary surfaces within the chamber are substantially parallel to each other in the region adjacent to the chamber exit opening as viewed in a direction perpendicular to the stretching direction within the plane of the film passing therethrough. In this embodiment it is preferred that stationary surfaces form an included angle within the range of about 4° to about 45°. It is most preferred in the film process that the included angle between the stationary surfaces is within the range of about 4° to about 10° as viewed from the exit opening. It is most preferred that the thickness of the blank divided by the thickness of the exit opening be within the range of about 2 to about 12 to provide a mechanical stretching ratio to the blank within the range of about 2 to about 12.

In the film process it is preferred that the opposed converging surfaces be electrically conductive, electrically insulated from each other, and the electric field is applied by electrically connecting one of the conductive surfaces to a first direct current voltage source and the other conductive surface either to ground or to a second direct current voltage source of an opposite polarity to that of the first source.

In the film process it is preferred that the exit opening have a thickness within the range of about 0.002 inch to about 0.100 inch and the blank thickness is about 2 to about 12 times the thickness of the exit opening.

It is preferred that the current source provided a voltage potential within the range of about 250 volts per mil of product thickness to about 20,000 volts per mil of product thickness.

It is preferred that the film be annealed while maintained in an electrically unshorted state and held at substantially constant length at a temperature that is less than the melting temperature of the polymer material.

In another embodiment of the film process the polymer blank comprises two polymer films having an electrically conductive foil material sandwiched therebetween, and the electric field is provided by applying a direct current voltage potential between the conductive foil material and each of the converging surfaces.

In the film process it is most preferred that the included angle of the stationary surfaces be within the range of 6° to 15°, the stretch ratio is within the range of 3 to 6, and the polymer material is polyvinylidene fluoride or a copolymer of the vinlyidene fluoride and tetrafluoroethylene.

In another embodiment of this invention the process provides a tubular product having an electrically conductive central core and tube walls comprised of the polymer, which comprises forming a tubular blank in (a) having a center electrically conductive wire core and tube walls comprised of the polymer material; in (b) the converging stationary surfaces are the interior surfaces of a tapered, conically shaped die, said die having an entrance opening of a size that is substantially equal to or greater than the cross sectional size of the tubular blank with its core and the exit opening is of a size substantially equal to the cross sectional area of the tubular product.

In the tubular process it is preferred that the cross sectional area of the tube wall of the blank divided by the cross sectional area of the tube wall of the tubular product be within the range of about 2 to about 12 to provide a stretch ratio to the polymer material within the range of about 2 to about 12. It is preferred that the central core is a wire and that the blank is formed by extruding the polymer around the wire to provide the tubular blank with a wire core. It is preferred that the interior surfaces of the die form an included angle within the range of about 4° to about 45° and it is most preferred that the included angle be within the range of about 6° to about 15°.

In another embodiment of the invention the interior surfaces of the tubular die are electrically conductive and a first direct current voltage source is electrically connected to either the interior surface of the die or to the central core of the tubular blank, and either the core of the interior surface that is not connected to the first voltage source is connected to ground or to a second direct current voltage source of a polarity opposite to the first source. It is preferred that the electrical field provide a voltage potential within the range of about 250 to 20,000 volts per mil of total tube wall product thickness.

The tubular product can also be annealed by maintaining the product in an electrically unshorted state while holding at substantially constant length and maintaining a temperature that is less than the melting temperature of the polymer material.

For both the film and tubular processes of this invention it is preferred that the polymer material be a polymer or mixture of polymers selected from the group consisting essentially of polyvinylidene fluoride, polyvinyl fluoride, polyvinylchloride, polyamides, and co-polymers or terpolymers containing a major portion of vinylidene fluoride with at least one copolymerizable monomer selected from the group consisting essentially of trifluoroethylene, tetrafluoroethylene and vinyl fluoride.

With the tubular process it is most preferred that the included angle of the surfaces be within the range of 6° to about 15°, the stretch ratio is within the range of 3 to 6, and the polymer material is polyvinylidene fluoride or a copolymer of vinylidene fluoride and tetrafluoroethylene.

The apparatus of this invention, useful in carrying out the foregoing processes, is described as an apparatus for the production of a piezoelectric polymer product from a polymer material blank having a blank thickness that exceeds that of the polymer product, which comprises:

(a) a polymer drawing die having internal opposed converging surfaces that form a stretching chamber, said chamber having an entrance opening adapted to receive the blank that is about equal to or greater in cross sectional area than the material blank that it is adapted to receive and an exit opening adapted to discharge the product that is about equal to the cross sectional area of the polymer product;

(b) electrical field producing means adapted to subject the stretching chamber and a polymer material blank passing therethrough to a direct current electric field; and (c) pulling means operatively associated with the die in (a) and adapted to pull a polymer product from the exit opening of the stretching chamber of the die to provide simultaneous stretching and electrical poling to a polymer material blank while passing through the stretching chamber of the die.

It is preferred that the opposed stationary surfaces form an included angle within the range of about 4 to about 45 degrees, that the electrical field means provide a D.C. voltage potential within the range of about 250 to about 20,000 volts per mil of : the shortest dimension of the exit opening for film or that of the product wall thickness for tubular products, and that the shortest dimension of the exit opening divided by the shortest dimension of the entrance opening is with the range of about 2 to about 12 for film. For tubular products, the cross sectional area of the blank tube wall divided by that for the product tube wall is from about 2 to 12.

It is preferred that the exit opening shortest dimension be about 0.002 inch to 0.100 inch and the entrance opening is about 2 to about 12 times that of the exit opening.

The apparatus for the tubular produce is as above defined, wherein the converging stationary surfaces are the interior surfaces of a tapered, conically shaped die that is adapted to receive a tubular blank having a central wire core to provide a tubular product with a wire core. It is preferred that the interior surfaces are comprised of an electrically conductive material and the electrical field producing means comprises a first direct current voltage source electrically connected to either the interior surface of the die or to the central core of the tubular blank that it is adapted to receive and either the wire core or the interior surface that is not connected to the first voltage source is electrically connected to ground or to a second direct current voltage source of a polarity opposite to the first source.

A preferred apparatus for providing a film product is as above defined, wherein the opposed stationary surfaces forming the chamber are substantially parallel to each other in the region adjacent to the chamber exit opening as viewed in a direction perpendicular to the stretching direction within the plane of the path of a blank therethrough.

BRIEF DESCRIPTION OF THE DRAWINGS

The invention is described in greater detail hereinafter relative to the nonlimitative embodiments and the attached drawings wherein.

DETAILED DESCRIPTION OF THE PREFERRED EMBODIMENTS

Figure 1:
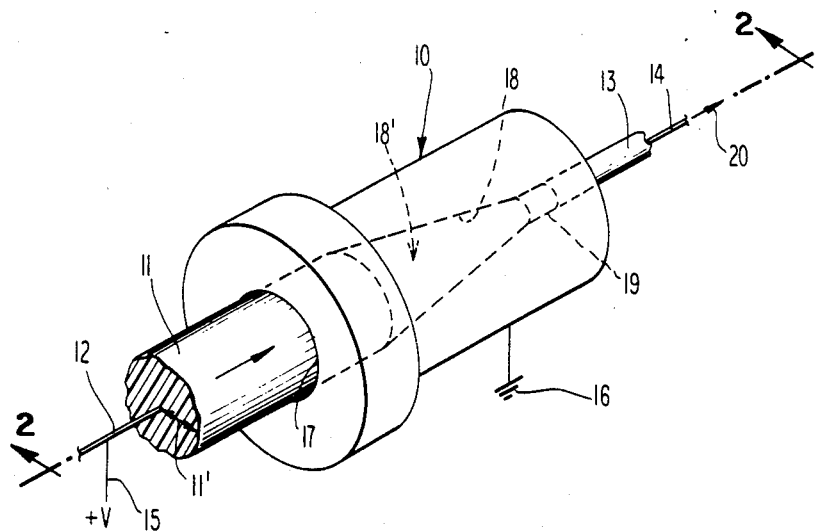
FIG. 1 is an isometric view of a tapered die useful for preparing a piezoelectric tubular product having a wire core.
Figure 2:
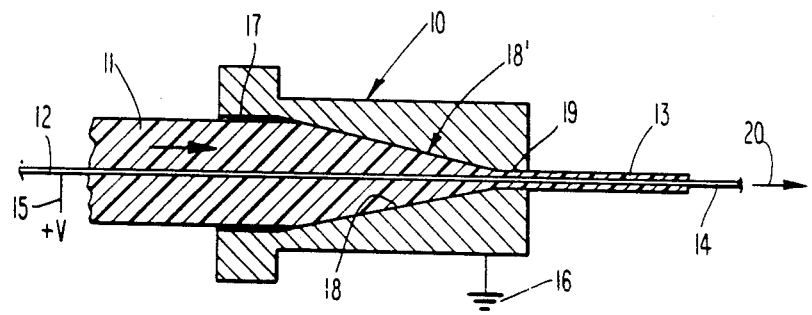
FIG. 2 is a longitudinal view in section along line 2—2 of FIG. 1.

With particular reference to FIGS. 1 and 2, which illustrate the tapered die drawing apparatus and process for providing a tubular product with a wire core, the various parts of the drawings are identified as follows: cylindrical tapered die 10 is shown with the tubular blank 11 having a wall thickness 11' with a central wire core 12. The initial polymer blank 11 after exiting from the die is depicted as 13 and the wire core as 14 after exit from die 10. Voltage source 15 in conjunction with electrical ground 16 illustrate the means for providing the electric field. It is understood that other means for providing the electric field are acceptable, such as providing a DC voltage of one polarity to the central core 20 and a DC voltage of an opposite polarity to the tapered die. It is understood that the electric field can be of an intensity up to the breakdown voltage of the polymer blank under the particular processing conditions.

With respect to the tapered die in FIGS. 1 and 2, die entrance opening 17 leads to the tapered section 18 of the die with tapered section 18 defining the stretching chamber 18' of the die which terminates adjacent to die exit opening 19 which defines and determines the approximate product thickness exiting at the chamber exit opening 19. The tubular product is being pulled or drawn through the die from a pulling means, such as a driven draw rolls schematically shown as 20.

Figure 3:
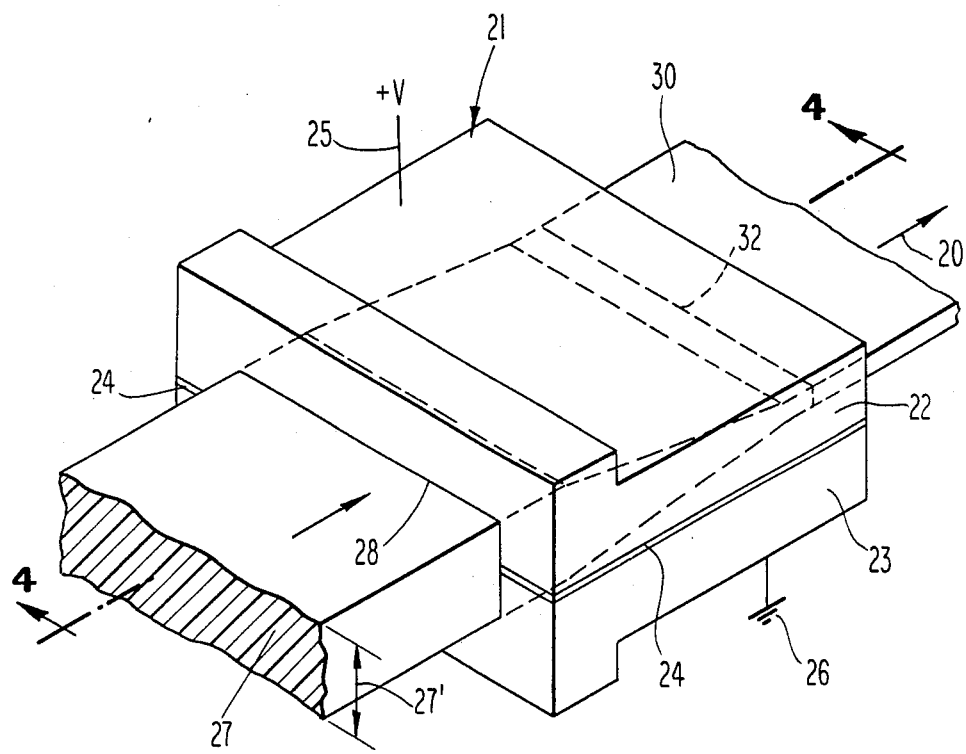
FIG. 3 is an isometric view of a flat type drawing die for providing piezoelectric film or sheet materials having a substantially rectangular cross section.
Figure 4:
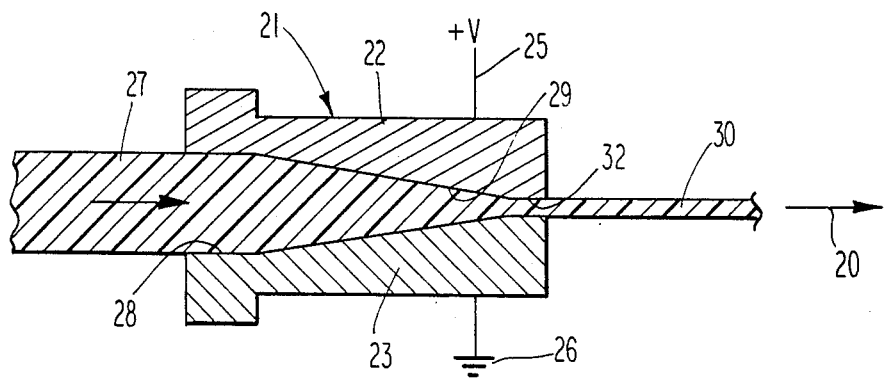
FIG. 4 is a longitudinal view in section along line 4—4 of FIG. 3.

With respect to FIGS. 3 and 4 which depict an apparatus to provide a piezoelectric film or sheet product of the invention, the flat die 21 is comprised of top half 22 and bottom half 23 with the two halves 22, 23 being electrically insulated from each other by electrical insulator 24. 25 depicts the voltage source and 26 the electrical ground. The film blank 27 of substantial rectangular cross sectional shape has thickness 27', enters entrance zone 28 and then passes into the tapered zone or stretching chamber 29 of the flat die 21, comprised of the opposed stationary surfaces from the die top half 22 and bottom half 23. Exiting sheet or film 30 is then taken up by the driven drawing or stretching source roll shown schematically as 20 after passing exit zone 32 of the die.

Figure 5:
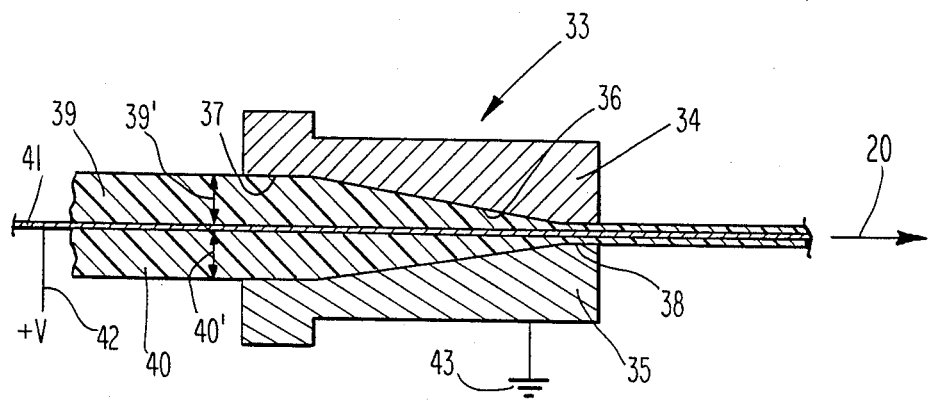
FIG. 5 is a longitudinal view in section of a flat drawing die similar to FIG. 4 except that the film or sheet material is comprised of two layers having an electrically conductive metal foil or flim sandwiched therebetween and the opposed surfaces of the die are electrically insulated from each other.

FIG. 5 depicts another embodiment of the film apparatus and process of this invention wherein a layered film having a metallic foil sandwiched therebetween is formed. Die 33 is comprised of upper half 34 and lower half 35 which defines the tapered zone or the stretching chamber 36 having entrance opening 37 and exit opening 38. The polymeric top blank 39 has thickness 39' and the lower polymeric blank 40 has thickness 40'. The two blanks 39 and 40 have electrically conducting foil 41 sandwiched therebetween and voltage source 42 is shown in conjunction with ground 43 as the means for providing the electrical field of sufficient intensity. The exiting film leaves through exit opening 38 and is pulled from the die with powered draw means 20. As shown in the schematic diagram of FIG. 7, it is understood that in any of these embodiments an annealing section is preferably provided between the exit of the particular die and the powered draw rolls. With reference to FIG. 5 the upper half 34 of the die and lower half 35 of the die are not electrically insulated from each other, and the electric field is supplied by applying a DC voltage of one polarity to the foil 41 and a DC voltage of another polarity to the die, both of which are comprised of an electrically conductive material. Of course, either the foil 41 or the die could be grounded and the other connected to a D.C. voltage source.

Figure 6:
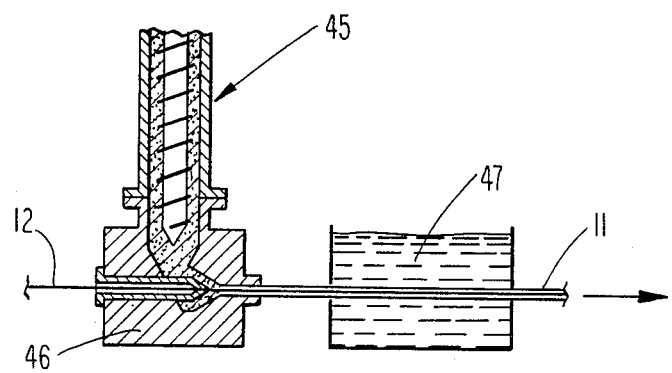
FIG. 6 is a schematic of a plastic extruder for providing a tubular polymeric blank having a wire core.

FIG. 6 is a schematic diagram that illustrates, in general, the preparation of the tubular blank. With reference to FIG. 6, extruder 45 has die 46 which extrudes polymeric material around wire 11 which is then solidified in cooling bath 47 to provide the polymeric material blank 11.

Figure 7:
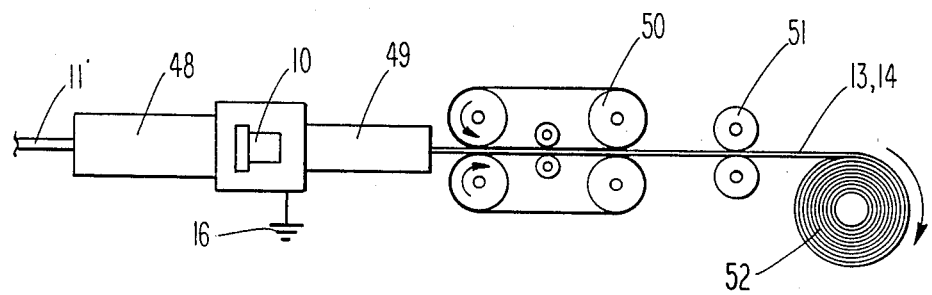
FIG. 7 is a schematic diagram wherein the arrangement of parts for the die drawing process are illustrated.

FIG. 7 is a schematic diagram illustrating the stretching process of the invention with respect to a tubular product. Blank 11 is passed through oven 48 where it is heated to a temperature below the melting point of the polymeric material and it is then drawn through die 10 wherein it is drawn while being subjected to an electric field and then it passes through annealing section 49, through guide rolls drawing device 50, and capstan guide rolls 51 and then to the winder 52. The final product is depicted as plastic tube 13 having wire core 14.

EXAMPLES

EXAMPLE 1

A tubular brass die as depicted with reference to FIGS. 1 and 2 was utilized. The interior surfaces of the die formed an included angle of 14 degrees. The exit opening from the die was 0.110 inch in diameter and the land length was 0.1 inch.

A polymer material blank was formed, utilizing a conventional screw extruder, from Kynar 7200, a commercially available copolymer of vinylidene fluoride and tetrafluoroethylene. The extruded undrawn polymer tubing had an outside diameter of 0.215 inches and a wall thickness 0.025 inches. Into this tubing was inserted a 14 gauge copper wire and the end of the tubing was stretched onto the wire to a thickness of abut 0.110 inches. The tubing with the wire insert was then fed into the above die and pulled therefrom with the appropriate draw takeup roll. The tubing with the wire inserted was then drawn through the die which was maintained at a temperature of 50 degrees centigrade and the draw speed was 1 foot per minute. During the drawing process the total length of product wire core of about 30 feet was connected to a direct current voltage source maintained at 30,000 volts. The forming die which was comprised of an electrically conductive metal was electrically grounded. The oriented electrically treated (poled) sample was stored unshorted overnight. The ends of the sample were secured to prevent shrinkage of the insulation on the wire. The poled sample ends were released after a 24 hour exposure and the insulation shrank 10.3%. The tubular polymeric product with the wire core was then painted with a conductive paint and the piezoelectric hydrostatic d constant was 11 pc/N.

Similar results were obtained by subjecting the blank to voltages of 35,000 and 40,000 volts respectively.

EXAMPLE 2

The electrical connections were reversed from that employed in Example 1 and the voltage at the same level employed. The central core wire was connected to the electrical ground and the forming die was connected to the voltage source. The forming die had a land length of 0.750 inches and an exit opening of 0.100 inches. The entrance opening to the die was 0.75 inches and the working taper section of the die, the section of the die that actually made physical contact with the polymer blank, had an included angle of 10 degrees and was 1 inch in length. The die was formed of brass and the interior surfaces were polished to a smooth finish.

A tubular blank similar to that in Example 1 was formed except that a 16 gauge wire was used as the central core. The stretching ratio provided within the stretching chamber of the die was 5.5 to 1. The piezoelectric polymer tubular product was post-treated similar to that in Example 1. The piezoelectric hydrostatic d constant was 12 pc/N.

EXAMPLE 3

Using a tubular die similar to FIGS. 1 and 2 having a 10 degree included angle and an exit opening of 0.0978 inches, a commercially available Kynar 7200 polymer tube having a 16 gauge copper wire as the central core was prepared as the polymer material blank. The outside diameter of the tube blank was 0.200. The product was pulled from the die at a rate of 6 inches per minute and the electrical field maintained. The die and the polymer tubular blank were maintained at a temperature of 82 degrees Centigrade and the product was annealed for 4 minutes at 82 degrees Centigrade thereby reducing the shrinkage to less than about 2%. The final product had a piezoelectric hydrostatic $d_h$ constant of 16.8 pc/N.

EXAMPLE 4

This example illustrates the preparation of films by utilizing the apparatus as depicted in FIGS. 3 and 4. The Kynar 7200 polymer blank had a thickness of 0.125 inches and was fed into the apparatus that had an 8 degree included angle. The thickness of the blank was reduced to 0.030 inches providing a stretching ratio slightly in excess of 4.

Utilizing voltage fields similar to those in the preceding examples, it was found that piezoelectric hydrostatic d constants in excess of 10 were readily achieved under a variety of operating conditions.

EXAMPLE 5

Example 4 is repeated except that the material blank is comprised of two sheets of polymeric material having a metal foil sandwiched therebetween. The electric field is provided during the stretching by connecting the foil to ground and the flat die to the high voltage source. Utilizing conditions similar to the foregoing examples, similar piezoelectric hydrostatic d constants are achieved.

The following polymeric materials provide good polymer material blanks for use in the various processes and apparatus of the invention: a polymer of mixture of polymers selected from the group consisting essentially of polyvinylidene fluoride, polyvinyl fluoride, polyvinylchloride, polyamides, and copolymers or terpolymers containing a major portion of vinylidene fluoride with at least one copolymerizable monomer selected from the group consisting essentially of trifluoroethylene, tetrafluoroethylene and vinyl fluoride. Piezoelectric hydrostatic d constants in excess of 10 pc/N are readily achievable with all such polymeric materials under a variety of conditions whether prepared as a tubular product or as a film product of one or more layers.

Generally, the shallower the included angle of the stretching chamber, the higher the piezoelectric activity achieved at similar conditions. This is believed to be because such a shallower or smaller included angle provides a longer stretching chamber and the entire chamber is subjected to an electric field for a longer time period. Accordingly, this invention allows poling of the material while drawing for a longer period of time than the prior art processes such as crushing between opposed pressure rolls where all the simultaneous drawing and poling takes place at the nip or the neckdown area localized by heating of the blank.

We claim:

1. A process for the production of a piezoelectric tubular polymer product having an electrically conductive central core and tube walls comprised of the polymer by mechanical stretching and simultaneous electrical polarization, comprising:
    (a) forming a polymer material tubular blank having a tube wall thickness that exceeds that of the polymer product and a central electrically conductive core;
    (b) stretching the tubular blank while in a solidified state and reducing the thickness of the blank by pulling the blank between opposed converging stationary surfaces while maintaining the polymer material blank at a temperature below its melting point, said surfaces defining a stretching chamber having an entrance opening of a dimension substantially equal to or greater than the blank thickness and an exit opening of a dimension that is about equal to the product thickness, said converging stationary surfaces are the interior surfaces of a tapered, conically shaped die, said die having an entrance opening of a size that is substantially equal to or greater than the cross sectional size of the tubular blank with its core and the exit opening is of a size substantially equal to the cross sectional area of the tubular product;
    (c) simultaneously, while stretching in (b), applying an electric field across the thickness of the tubular blank within the stretching chamber, said electric field having a direct current voltage that is below the breakdown voltage of the material but the voltage, in combination with the residence time of the blank within the chamber, is of sufficient intensity to provide the electrical polarization to form the piezoelectric polymer product that is being pulled from the stretching chamber.

2. The process as defined in claim 1 wherein the cross section area of the tube wall of the blank divided by the cross sectional area of the tube wall of the tubular product is within the range of about 2 to about 12 to provide a stretch ratio of the polymer material within the range of about 2 to about 12.

3. The process as defined in claim 1 wherein the central core is a wire.

4. The process as defined in claim 3 wherein the blank is formed by extruding the polymer around the wire to provide the tubular blank with a wire core.

5. The process as defined in claim 3 wherein the blank is formed by forming a tube of the polymer material and then inserting the wire into the tube.

6. The process as defined in claim 1 wherein the interior surfaces of the die form an included angle within the range of about 4 degrees to about 45 degrees.

7. The process as defined in claim 1 wherein the interior surfaces of the die are electrically conductive and a first direct current voltage source is electrically connected to either the interior surface of the die or to the central core of the tubular blank and either the core or the interior surface that is not connected to the first voltage source is connected to ground or to a second direct current voltage source of a polarity opposite to the first source.

8. The process as defined in claim 7 wherein the voltage source or sources provide a voltage potential within the range of about 250 volts to about 20,000 volts per mil of the tube wall thickness of the product.

9. The process as defined in claim 1 wherein the tubular product, while maintained in an electrically shorted or unshorted state, is held at substantially constant length and annealed at a temperature that is less than the melting temperature of the polymer material.

10. The process as defined in any one of claims 1, 2, 3, 4, 5, 6, 7, 8, or 9 wherein the polymer material is a polymer or mixture of polymers selected from the group consisting essentially of polyvinylidene fluoride, polyvinyl fluoride, polyvinylchloride, polyamides, and copolymers or terpolymers containing a major portion of vinylidene fluoride with at least one copolymerizable monomer selected from the group consisting essentially of trifluoroethylene, tetrafluoroethylene and vinyl fluoride.

11. The process as defined in claim 10 wherein the included angle of the surfaces is within the range of 6 degrees to 15 degrees, the stretch ratio is within the range of 3 to 6, and the polymer material is polyvinylidene fluoride or a copolymer of vinylidene fluoride and tetrafluoroethylene.

12. The process as defined in any one of claims 1, 2, 3, 4, 5, 6, 7, 8, or 9 wherein the polymer material blank is maintained at a temperature within the range of about 40 degrees centigrade up to about the melting point of the polymer material blank while passing between the opposed converging stationary surfaces.

13. In combination, an apparatus for the production of a piezoelectric tubular polymer product having an electrically conductive central core and tube walls comprising the polymer from a solidified polymer material blank having a blank thickness that exceeds that of the polymer product, which comprises:

(a) a polymer drawing die having internal opposed converging surfaces that form a stretching chamber, said chamber having an entrance opening adapted to receive the blank that is about equal to or greater in cross sectional area than the material blank that it is adapted to receive and an exit opening adapted to discharge the product that is about equal to the cross sectional area of the polymer product, said converging stationary surfaces are the interior surfaces of a tapered, conically shaped die that is adapted to receive a tubular blank having a central wire core to provide a tubular product with a wire core;

(b) electrical field producing means adapted to subject the stretching chamber and a polymer material blank passing therethrough to a direct current electric field; and (c) pulling means operatively associated with the die in (a) and adapted to pull a tubular polymer product from the exit opening of the stretching chamber of the die to provide simultaneous stretching and electrical poling to a polymer material blank while in a solidified state passing through the stretching chamber of the die.

14. The apparatus as defined in claim 13 wherein in (b) the electrical field producing means provides an electrical field that is of sufficient intensity to provide electrical polarization to a material blank passing through the stretching chamber but is less than the breakdown voltage of the blank.

15. The apparatus as defined in claim 14 wherein the electrical field has voltage potential within the range of about 250 to about 20,000 volts per mil of the shortest dimension of the exit opening.

16. The apparatus as defined in claim 14 wherein the stationary surfaces form an included angle within the range of about 4 degrees to about 45 degrees.

17. The apparatus as define din claim 14 wherein the cross sectional area of the polymer path of the exit opening divided by the cross sectional area of the polymer path of the entrance opening is within the range of about 2 to about 12.

18. The apparatus as defined in claim 14 wherein the exit opening shortest dimension is within the range of about 0.002 inch to about 0.100 inch and the entrance opening shortest dimension is about 2 to about 12 times that of the exit opening.

19. The apparatus as define din claim 13 wherein the interior surfaces are comprised of an electrically conductive material and the electrical field producing means comprises a first direct current voltage source electrically connected to either the interior surface of the die or to the central core of the tubular blank that it is adapted to receive and either the wire core or the interior surface that is not connected to the first voltage source is electrically connected to ground or to a second direct current voltage source of a polarity opposite to the first source.

20. The apparatus as defined in any one of claims 13, 14, 15, 16, 17, or 18 wherein the opposed converging surfaces are electrically conductive surfaces that are electrically insulated from each other and the electrical field producing means comprises a first direct current voltage source electrically connected to one of the conductive surfaces and the other conductive surface is connected either to ground or to a second direct current voltage source of an opposite polarity to the first source.

21. The apparatus as defined in any one of claims 13, 14, 15, 16, 17, 18, or 19 wherein annealing means are operatively arranged between the exit opening of the die and the pulling means, said annealing means being adapted to maintain an exiting product in an electrically shorted or unshorted state at substantially constant length and apply a temperature to the product passing therethrough that is less than the melting temperature of the polymer material.

22. The apparatus as defined in claim 21 wherein heater means, adapted to heat and maintain a blank at a temperature within the range of about 40 degrees centigrade up to slightly less than the polymer blank melting point, are operatively associated with the die.

* * * * *